US012049702B2

(12) United States Patent
Han et al.

(10) Patent No.: US 12,049,702 B2
(45) Date of Patent: Jul. 30, 2024

(54) VERTICAL BRANCHED GRAPHENE

(71) Applicants: Commonwealth Scientific and Industrial Research Organisation, Acton (AU); NewSouth Innovations Pty Limited, Sydney (AU)

(72) Inventors: Zhaojun Han, Acton (AU); Constantine Tsounis, Kensington (AU); Rose Amal, Kensington (AU)

(73) Assignees: COMMONWEALTH SCIENTIFIC AND INDUSTRIAL RESEARCH ORGANISATION, Acton (AU); NEWSOUTH INNOVATIONS PTY LIMITED, Sydney (AU)

( * ) Notice: Subject to any disclaimer, the term of this patent is extended or adjusted under 35 U.S.C. 154(b) by 248 days.

(21) Appl. No.: 17/434,896

(22) PCT Filed: Feb. 28, 2020

(86) PCT No.: PCT/AU2020/050187
§ 371 (c)(1),
(2) Date: Aug. 30, 2021

(87) PCT Pub. No.: WO2020/176929
PCT Pub. Date: Sep. 10, 2020

(65) Prior Publication Data
US 2022/0056599 A1 Feb. 24, 2022

(30) Foreign Application Priority Data

Mar. 1, 2019 (AU) ................................ 2019900665

(51) Int. Cl.
| | | |
|---|---|---|
| *C01B 32/184* | (2017.01) | |
| *C01B 32/186* | (2017.01) | |
| *C01B 32/194* | (2017.01) | |
| *C23C 16/26* | (2006.01) | |
| *C23C 16/44* | (2006.01) | |
| *C23C 16/50* | (2006.01) | |
| *C23C 16/56* | (2006.01) | |
| *C25B 1/02* | (2006.01) | |
| *C25B 3/07* | (2021.01) | |
| *C25B 3/26* | (2021.01) | |
| *C25B 11/065* | (2021.01) | |
| *H01B 1/04* | (2006.01) | |
| *H01M 4/62* | (2006.01) | |
| *H01G 11/34* | (2013.01) | |

(52) U.S. Cl.
CPC .......... *C25B 11/065* (2021.01); *C01B 32/184* (2017.08); *C01B 32/186* (2017.08); *C01B 32/194* (2017.08); *C23C 16/26* (2013.01); *C23C 16/4418* (2013.01); *C23C 16/50* (2013.01); *C23C 16/56* (2013.01); *C25B 1/02* (2013.01); *C25B 3/07* (2021.01); *C25B 3/26* (2021.01); *H01B 1/04* (2013.01); *H01M 4/625* (2013.01); *C01P 2002/82* (2013.01); *C01P 2002/85* (2013.01); *C01P 2004/03* (2013.01); *C01P 2006/40* (2013.01); *H01G 11/34* (2013.01)

(58) Field of Classification Search
CPC ............................ C01B 32/184; C01B 32/194
See application file for complete search history.

(56) References Cited

U.S. PATENT DOCUMENTS

2017/0190582 A1  7/2017  Fu et al.

OTHER PUBLICATIONS

Ma et al., "Experimental Investigation on Vertically Oriented Graphene Grown in a Plasma-Enhanced Chemical Vapor Deposition Process," ACS Applied Materials & Interfaces (Feb. 22, 2019), vol. 11, No. 10, p. 10237-10243. (Year: 2019).*
Extended European Search Report from corresponding EP Patent Application No. 20765703.2, dated Nov. 1, 2022, 12 pp.
Guo et al., "One-step Growth of Graphene-Carbon Nanotube Trees on 4" Substrate and Characteristics of Single Individual Tree," Carbon, 125 (2007) pp. 189-198.
Ma et al., "A Flexible Supercapacitor Based on Vertically Oriented 'Graphene Forest' Electrodes," Journal of Materials Chemistry A, 3 (2015) pp. 21875-21881.
Zhang et al., "Highly-branched vertically-oriented graphene nanosheets with dense open graphitic edge planes as Pt support for methanol oxidation," Phys. Status Solidi B, 251, 4 (2014) pp. 829-837.
Ma et al., "Experimental Investigation on Vertically Oriented Graphene Grown in a Plasma-Enhanced Chemical Vapor Deposition Process," ACS Applied Materials & Interfaces, 11 (2019) pp. 10237-10243.
Kim et al., "Straightforward Fabrication of a Highly Branched Graphene Nanosheet Array for a Li-ion Battery Anode," Journal of Materials Chemistry, 22 (2012) pp. 15514-15518.
Watanabe et al., "Control of Super Hydrophobic and Super Hydrophilic Surfaces of Carbon Nanowalls Using Atmospheric Pressure Plasma Treatments," Japanese Journal of Applied Physics, 51 (2012) pp. 01AJ07-1-01AJ07-4.

(Continued)

*Primary Examiner* — Stuart L Hendrickson
(74) *Attorney, Agent, or Firm* — Crowell & Moring LLP

(57) ABSTRACT

Provided are a method for preparing a vertical branched graphene comprising treating a pristine vertical graphene with an inert plasma in the absence of an introduced carbon source to develop a vertical branched graphene. The method may also include pre-treating a substrate surface with an inert plasma; depositing a pristine vertical graphene onto the substrate surface by contacting the substrate surface with a deposition plasma comprising a carbon source gas for a deposition period. Also provided are a vertical branched graphene attached to a substrate surface, the vertical branched graphene having a trunk portion extending from the substrate surface, said trunk possessing an increased degree of branching as the distance from the substrate surface increases; and a freestanding branched graphene with a proximal end and a distal end, the proximal end comprising a trunk portion, the trunk portion possessing and increased degree of branching as the distance from the proximal end increases and the distance to the distal end decreases.

20 Claims, 14 Drawing Sheets

(56) References Cited

OTHER PUBLICATIONS

Written Opinion of the International Searching Authority from corresponding International Application No. PCT/AU2020/050187, dated May 6, 2020, 6 pp.

* cited by examiner

VERTICAL BRANCHED GRAPHENE

RELATED APPLICATIONS

The present patent document is the national stage of International Patent Application PCT/AU2020/050187, which was filed on Feb. 28, 2020, and which claims the benefit of priority to Australian Patent Application No. 2019900665, which was filed on Mar. 1, 2019. Both of the preceding patent applications are hereby incorporated by reference in their entirety.

FIELD OF THE INVENTION

The invention relates to a new form of graphene having a hierarchical or branched structure and to processes for the preparation thereof. The hierarchical or branched graphene is useful in applications where high surface area graphene is required, such as energy storage devices and catalyst supports.

BACKGROUND ART

Graphene exhibits unique electronic, optical, chemical and mechanical properties. Because of its extremely high electron mobility (electrons move through graphene about 100 times faster than silicon), very low absorption in the visible spectrum and relative flexibility and elasticity (compared to inorganics such as indium tin oxide), supported horizontal graphene sheeting as an active functional material has been revolutionising the fields of flexible, transparent and ultra-light nano-devices, from optoelectronics to sensors. Graphene flakes, in which the graphene is exfoliated from any supporting surface, is also a highly useful material, having high thermal and electrical conductivity as well as being extremely lightweight.

Although graphene is normally a flat, sheet like substance, it also has the ability to be deposited onto substrates such that graphene structures can be created in a way that allows for a degree of vertical orientation, that is, the primary direction of the graphene planes is orthogonal to the deposition surface. This vertical growth allows for the creation of controlled graphene microstructures, which are potentially useful in electron emission, bio-recognition and drug/gene/protein delivery applications among others. Graphene in a vertical orientation, commonly referred as vertical graphene or graphene nanowalls, offers substantially enhanced functionality compared to horizontally oriented graphene. This is due to enabled vertical in-plane ultra-fast charge transport through the accessible basal planes which also provide a relatively high density of low contact-resistance sites for adsorbing and/or immobilising a range of quantum dots, chemical and bio-specific molecules, for example.

The vertical graphene does not need to be supported on a surface in order to be useful. For instance, isolated vertically formed graphene flakes can readily be produced with surface areas in excess of 400 $m^2/g$. This is a much higher surface area per unit density than commercial graphene powders made from traditional chemically produced graphene flakes.

The vertically formed graphene typically has an open and three-dimensional (3D) structure, a high density of reactive edges, around 3-15 graphitic layers and a surface area of around 400 $m^2/g$ with good electrical conductivity. It is possible to control the vertical height of the graphene flakes, for example, vertical graphene of 0.5 to 20 μm can readily be produced as required.

When viewed from above, looking down towards the substrate on which the vertically formed graphene sheets have been deposited, it can be observed that the vertically formed graphene sheets form an interconnected network, with the graphene sheets arising from multiple growth lines on the substrate surface. The structure has been described in some publications as "maze-like vertical graphene", to reflect the appearance of a somewhat irregular thin walled maze when viewed from above.

Vertically formed graphene is readily made using typical plasma-assisted or plasma-enhanced vapour deposition processes and can be formed virtually on any surface which is thermally stable at ~400° C. This includes various metal substrates, such as stainless steel, Ni, Al, and Cu; semiconductor materials such as Si wafer, quartz and sapphire, as well as non-traditional deposition substrates such as carbon paper and carbon fibre, Ni foam and Cu foam and so on. The process is relatively simple, and no catalyst is required.

Further, the vertical graphene flakes can be readily exfoliated from the graphene growth substrate by mechanical means, such as scraping or vibration (ultrasonic vibration) in order to produce freestanding graphene powders. Many of the useful properties of vertically formed graphene remain even when it is removed from the formation surface by relatively straightforward mechanical means.

Vertical graphenes can also be readily functionalised. The carbon atoms at the tip of vertically grown graphene are considerably more reactive than the carbons in the basal plane, as well as being less hindered sterically than carbon atoms in the body of the vertical graphene, which are likely to be encumbered by adjacent vertical graphene grains. For instance, vertical graphene can be oxidised to produce a graphene surface with increased hydrophilicity.

The potential for graphene to reach very high surface areas per unit volume has led to a variety of approaches to attempt to further increase the surface area by various forms of branching. While vertical graphene can be grown on a wide range of substrates without the use of any catalyst, the approaches to branch graphene usually rely on tuning the concentration of carbon precursors or using high C-content precursors (e.g., $C_2H_2$) in a single-step plasma-assisted chemical vapor deposition processes and generally require the use of external heating of the substrate beyond that induced by the depositing plasmas. This need for temperature (usually >700° C.) has meant that branched forms of graphene have been limited to growth on certain substrates.

Vertical graphene is potentially useful in a number of applications including:
  Supercapacitors
  Li-ion batteries
  Catalyst support for hydrogen generation (both hydrogen evolution reaction HER and oxygen evolution reaction OER)
  Catalyst support for CO2 reduction
  Fuel cells (both hydrogen oxidation reaction HOR & oxygen reduction reaction ORR)
  Solid-state and flexible energy storage devices
  Flow batteries
  Structural and multifunctional devices It thus appears that new forms of vertically produced graphene may be potentially useful materials in a number of fields.

There is also a need to produce new forms of vertical graphene that exhibit desirable controllable electronic, optical and mechanical properties.

Any discussion of the prior art throughout the specification should in no way be considered as an admission that such prior art is widely known or forms part of common general knowledge in the field.

It is an object of the present invention to overcome or ameliorate at least one of the disadvantages of the prior art, or to provide a useful alternative.

SUMMARY

According to a first aspect the invention provides a method of preparing a vertical branched graphene comprising the step of treating a pristine vertical graphene with an inert plasma in the absence of an introduced carbon source to develop graphene.

Preferably, the pristine vertical branched graphene comprises an interconnected network of vertical graphene sheets.

Preferably, the inert plasma used to develop vertical branched graphene is an Argon plasma. Preferably the Ar plasma is applied at a pressure of <5 Pa, for instance, 0.5 to 2 Pa at a radio frequency of 10-15 MHz and a power of 500-2000 W, or more preferably the Ar plasma is applied at a pressure of 1.5 Pa at a radio frequency of 13.56 MHz and a power of 1000 W.

The vertical graphene may be treated with an inert plasma for a predetermined period to produce a predetermined level of branching. For example, the predetermined period is at least 1 minute, or at least 5 minutes or at least 10 minutes or up to 20 minutes.

For preference, the only heating applied is heating by the plasma. Preferably, the substrate temperature is less than 500° C.

According to a second aspect the invention provides a method of preparing a vertical branched graphene comprising the steps of:
  a) pre-treating a substrate surface with an inert plasma, wherein the only heating applied on the substrate is heating provided by the plasma;
  b) depositing a pristine vertical graphene onto the substrate surface by contacting the substrate surface with a deposition plasma comprising a carbon source gas for a deposition period;
  c) treating the vertical graphene with an inert plasma in in the absence of any introduced carbon source, to develop a vertical branched graphene with vertical branched graphene structure.

According to a third aspect the invention provides a method of preparing a vertical branched graphene consisting of the steps of:
  a) pre-treating a substrate surface with an inert plasma, wherein the only heating applied on the substrate is heating provided by the plasma;
  b) depositing pristine vertical graphene onto the substrate surface by contacting the substrate surface with a deposition plasma comprising a carbon source gas for a deposition period;
  c) treating the vertical graphene with an inert plasma in the absence of any introduced carbon source, to develop a vertical branched graphene with vertical branched graphene structure.

Preferably the pristine vertical branched graphene comprises an interconnected network of vertical graphene sheets. Preferably, the distance between the graphene sheets is less than 2 m at the surface furthest away from the substrate.

Preferably the inert plasma used to pre-treat the substrate surface and/or to develop a vertical branched graphene structure is an Argon plasma. The inert plasma used to pre-treat the surface may be the same as the inert plasma used to develop the vertical branched graphene, or it may be different.

Preferably, the Ar plasma is applied at a pressure of 0.5 to 2 Pa.

Preferably, the Ar plasma is applied at a radio frequency of 10-15 MHz.

Preferably, the Ar plasma is applied at a power of 500-2000 W.

Preferably the Ar plasma is applied at a pressure of 0.5 to 2 Pa at a radio frequency of 10-15 MHz and a power of 500-2000 W, or more preferably the Ar plasma is applied at a pressure of 1.5 Pa at a radio frequency of 13.56 MHz and a power of 1000 W.

Preferably, pre-treating the substrate surface is for a period of 10 minutes.

Preferably, the deposition plasma comprising a carbon source is prepared by introducing a single-carbon source gas and hydrogen to the substrate surface without interruption of the inert plasma. The carbon source gas may be methane. Preferably the deposition plasma is at a pressure less than 2 Pa.

In one preferred embodiment, the deposition plasma is a plasma comprising argon, methane and hydrogen at 1.5-1.8 Pa.

Preferably depositing vertical graphene takes place without external heating of the substrate and wherein the only heating applied is heating by the plasma. Preferably the deposition plasma is directly introduced as a dry feed gas or a feed gas as supplied by a manufacturer without bubbling through water. Preferably depositing vertical graphene takes place at <600° C.

Preferably, depositing vertical graphene takes place at 400° C. Preferably depositing vertical graphene takes place for at least 10 minutes, more preferably 10-20 minutes.

Preferably after step b) but prior to step c) pressure is reduced to <2×10$^{-2}$ Pa.

In a fourth aspect the invention provides a vertical branched graphene attached to a substrate surface, the vertical branched graphene having a trunk portion extending from the substrate surface, said trunk possessing an increased degree of branching as the distance from the substrate surface increases.

The vertical branched graphene may be prepared by the method of any one of the first, second or third aspects.

The vertical branched graphene preferably has a relative ratio of the intensity of the Raman spectrum $I_D/I_G$ peaks is 1.1 or above, more preferably 1.4 or above, even more preferably 1.7 or above and most preferably 1.9 or above.

In a fifth aspect, the invention provides a freestanding branched graphene with a proximal end and a distal end, the proximal end comprising a trunk portion, the trunk portion possessing and increased degree of branching as the distance from the proximal end increases and the distance to the distal end decreases.

The freestanding branched graphene may be prepared by removing the vertical branched graphene of any preceding aspect from a substrate.

The freestanding branched graphene preferably has a relative ratio of the intensity of the Raman spectrum $I_D/I_G$ peaks is 1.1 or above, more preferably 1.4 or above, even more preferably 1.7 and most preferably 1.9 or above According to other aspects of the invention, there is provided a catalyst support comprising a vertical branched graphene or freestanding branched graphene of the present invention. Also provided is use of said catalyst support in an electrocatalytic process, such hydrogen or oxygen production or in the production of a liquid carbon product, such as the production of one or more of n-propanol, ethanol or formate formed from the reduction of CO2. The catalyst support comprising the branched graphene of the present invention may also be used in an energy storage device, such as a battery or supercapacitor.

Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

As used herein, the term "vertical graphene" refers to a planar graphene sheet or array of sheets anchored to a substrate and substantially orthogonal to the substrate. Such an array may also be referred to as "pristine vertical graphene". The terms 'vertical graphene' or 'pristine vertical graphene' referred to in this specification refers to planar graphene sheets or an array of sheets anchored to a substrate and substantially orthogonal to the substrate having a morphology of an interconnected network of vertical graphene sheets.

As used herein, the term "vertical branched graphene" refers to the branched graphene of the present invention, in which vertical graphene or pristine vertical graphene has been modified to exhibit branching.

As used herein, the term "freestanding branched graphene" refers to vertical branched graphene that is free from being anchored on a substrate.

DETAILED DESCRIPTION

Figure 1:
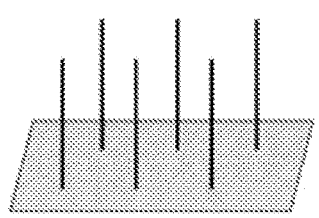
FIG. 1 shows a schematic of the two-stage process of the present invention, involving formation of pristine vertical sheets, and subsequent branching of the pristine vertical sheets.
Figure 1:
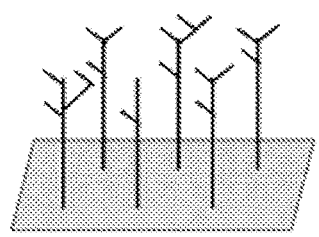
Figure 1:
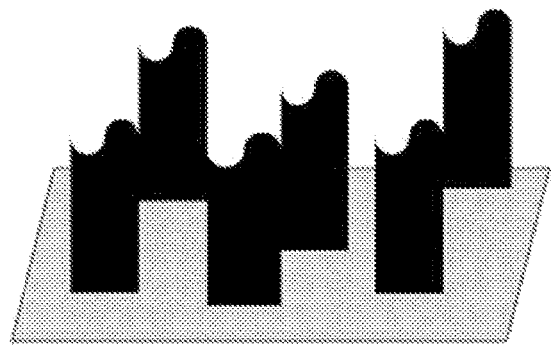
Figure 1:
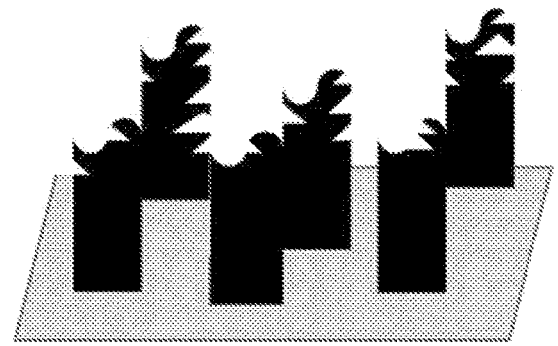
Figure 2:
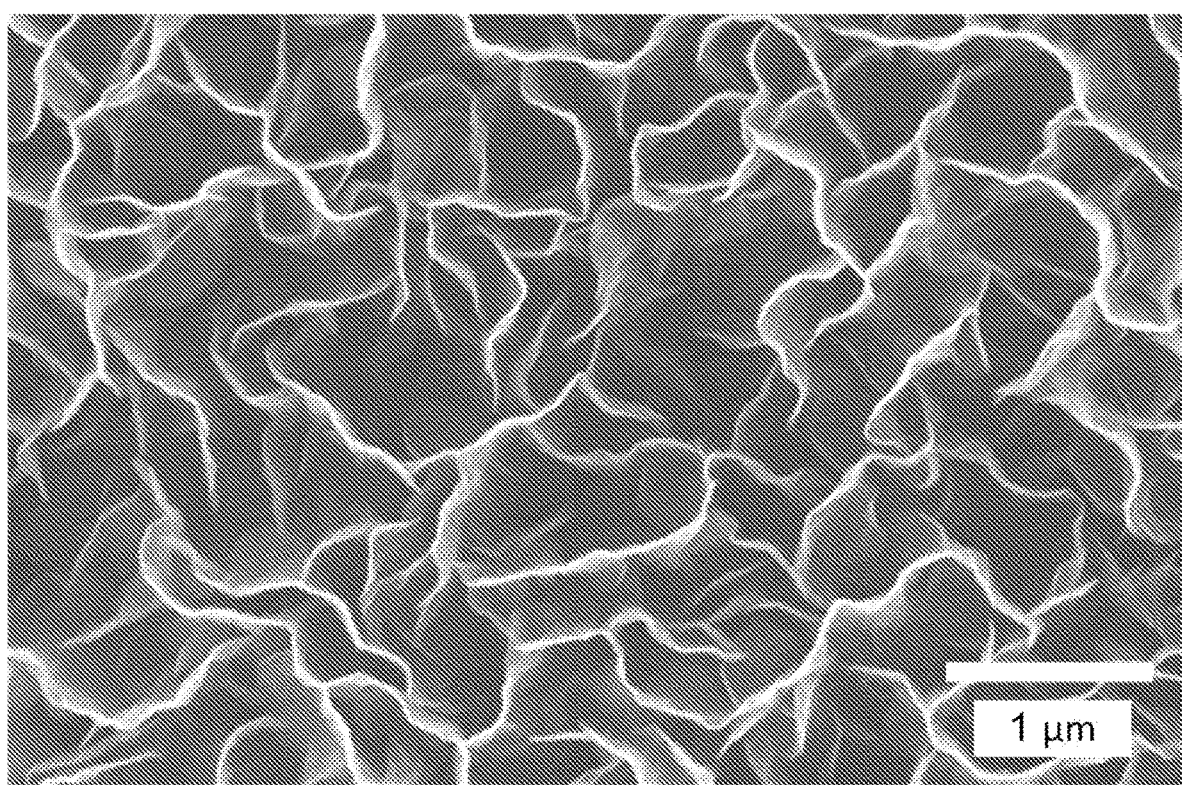
FIG. 2 shows a SEM image of pristine vertical graphene deposited without step c) post-treatment above, looking downwards towards the deposition substrate. The edges of the vertical graphene can be seen as brighter lines on the surface in the SEM image.
Figure 3:
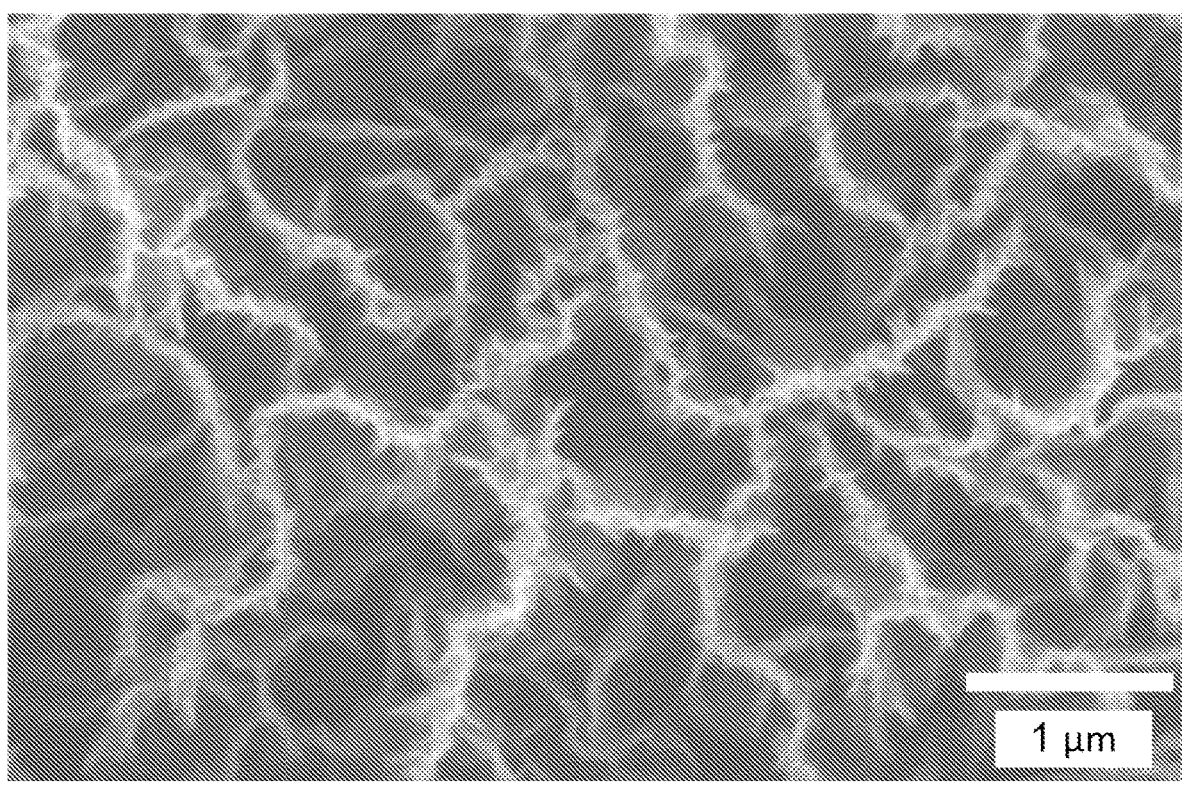
FIG. 3 shows a SEM image of a vertical graphene subjected to around 5 minutes post treatment with an inert plasma. The general vertical graphene appearance is present, but it can be seen that the edges are no longer purely linear sheet edges with smooth texture, but instead exhibit a degree of branching.
Figure 4:
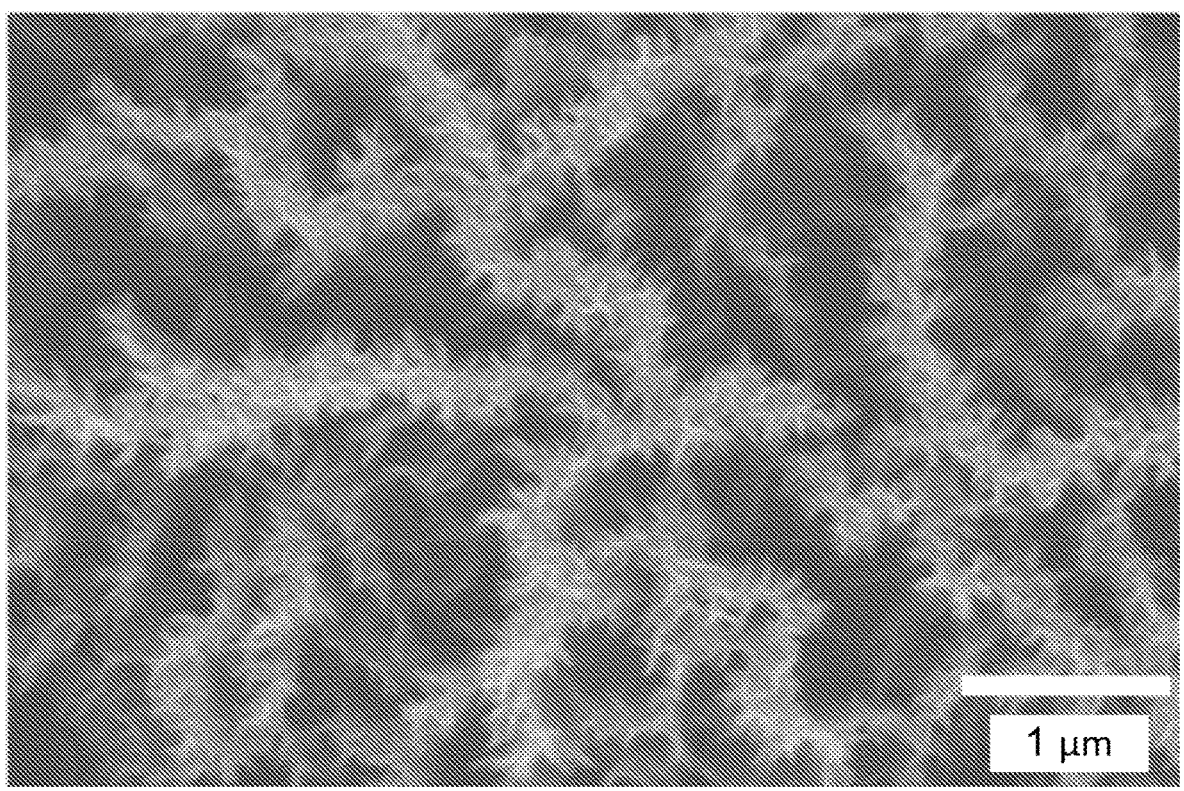
FIG. 4 shows a SEM image of a vertical graphene subjected to around 10 minutes post treatment with an inert plasma. The general vertical graphene appearance remains, but compared to FIG. 2, the degree of branching is more significant.
Figure 5:
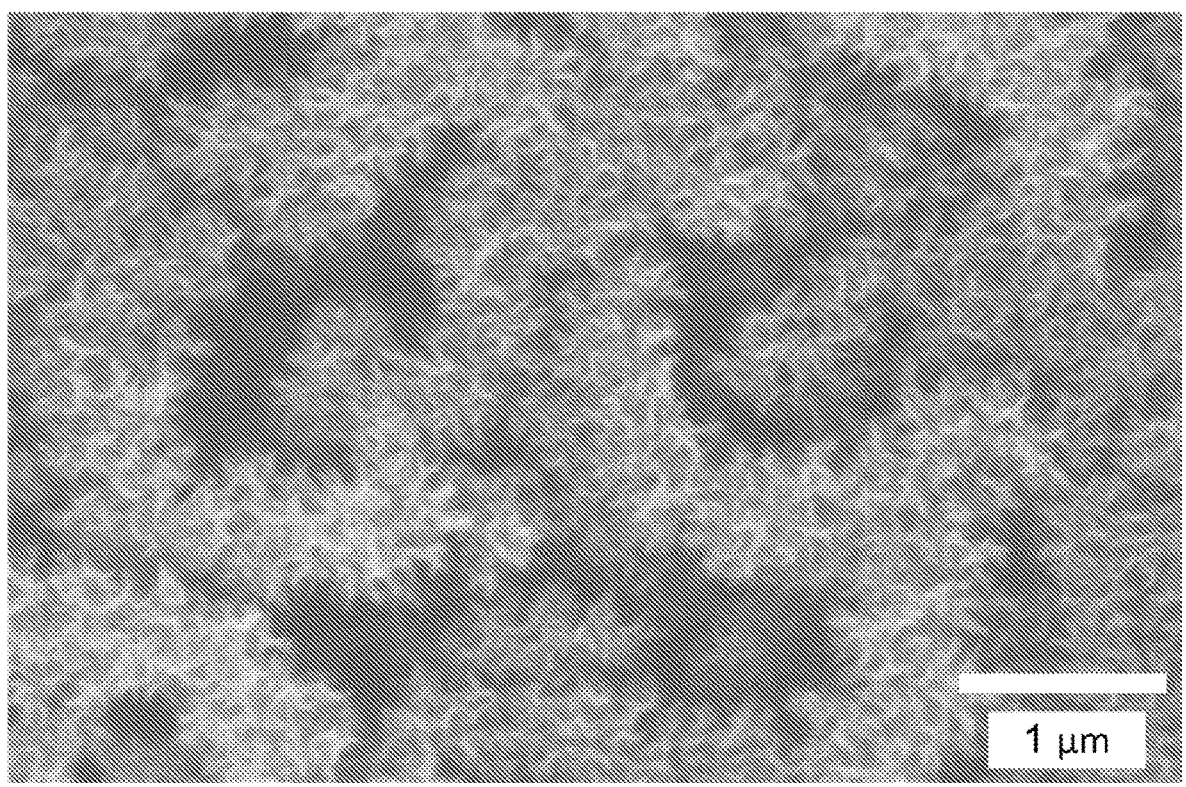
FIG. 5 shows a SEM image of a vertical graphene subjected to around 20 minutes post treatment with an inert plasma. The general vertical graphene appearance remains, but compared to FIGS. 3 and 4, the degree of branching is more significant and it can be seen that in some places, the branches are beginning to interlace, indicating that a hierarchical structure of branching is being approached.

The vertical branched graphene of the present invention can be produced in any suitable plasma-enhanced chemical vapour deposition (PECVD) apparatus.

In the general procedure of the present invention, a substrate is first loaded into a deposition chamber of a standard PECVD apparatus. Similar to previously described methods for preparing pristine vertical graphene, a wide variety of substrates can be used here—for example, a metallic substrate such as stainless steel, copper, aluminum or nickel can be used. Alternatively, the substrate can be a semiconductor, such as a silicon wafer, or an insulator such as quartz or sapphire can be used. Even carbon can be as substrate. In general, any suitable substrate that can withstand temperatures of ca. 400° C. can be used.

The substrate can also be present in any desired form. Generally, forms with relatively high surface areas to volume can be used, such as foils, wafers, papers, foams or fibres. Typically, traditional metal foils can be used, but other substrates such as silicon, quartz or sapphire wafers, carbon paper or fibres or nickel or copper foams can also be used. The branched graphene films of the present invention have been successfully prepared on carbon fibre paper (and Ni foam) which is a common substrate for electrochemical water splitting.

Importantly, the process does not require the presence of a catalyst at all.

Once the substrate is loaded into the chamber, and the chamber is sealed, the pressure is pumped down to a medium-high vacuum of less than about $<2\times10^{-2}$ Pa.

It is important at this stage to pre-treat the substrate with a plasma to clean it. Any suitable type of cleaning plasma can be used, usually an inert plasma, such as an Argon or Helium plasma. However, an Argon plasma is generally the most practical for the pre-treating stage, as it is used later in both the vertical graphene synthesis and post treatment (branching) phases.

The pre-treatment stage is important, as without Argon plasma pre-treatment, the vertical graphene was observed to adhere relatively weakly to the substrate which could be problematic for applying vertical graphene in device fabrication. When the surface was pre-treated with argon plasma, the adhesion to the substrate was generally stronger than un-treated or those pre-treated by $H_2$ plasma. Pre-treatment with $H_2$ plasma leads to graphene with unacceptably weak adhesion to the substrate surface.

Typically for the growth step, Ar at a flow rate of 10 standard cubic centimetre (sccm) is introduced into the chamber and the pressure is adjusted to 1.5 Pa. Ar plasma with a radio frequency (13.56 MHz) at power of 1000 W is ignited to pre-treat the substrate surface for 10 minutes. The radio frequency and power are selected as these are commonly used in commercial plasma apparatus. The flows, pressures, frequency and power and treatment time can all be varied in accordance with standard practices in the art to produce a cleaning plasma for pre-treatment.

The preferred gas for deposition of graphene in the present invention is methane, compared to alternative carbon source gases such as acetylene. Methane forms relatively clean plasmas due to its high thermal stability and low carbon content. Gases containing non-carbonaceous species that can react or incorporate into graphene materials (for instance, halo compounds such as $C_2F_6$) are wholly unsuitable as deposition agents in this case and of course are not provided during the branching step, which is free of any added carbon source gas.

In some deposition processes, it is desirable to bubble feed gases such as methane, acetylene, argon and the like through water prior to their introduction into the deposition chamber. The purpose of this step is to produce wet gases, where the ionization of water molecules helps clean the unwanted substances in the grown vertical graphene. In the present case, this additional step of producing wet feed gases was not necessary, and thus it is preferable to simply use dry feed gases (or feed gases as supplied) in the pre-treatment, deposition and branching steps.

Following the pre-treatment stage, the flow of Argon is supplemented, ideally in an uninterrupted manner, with a flow of both methane and hydrogen gases. The Argon, methane and hydrogen are introduced at a flow rate of 10 sccm each to the chamber while subjected to 13.56 MHz at 1000 W. This carbon plasma (deposition plasma) acts to form the pristine, or unbranched, vertical graphene. Again, the flows, pressures, frequency and power and treatment time can all be varied in accordance with standard practices in the art to produce a carbon plasma for generating vertical graphene. The pristine vertical graphene is essentially unbranched. This method of forming vertical unbranched graphene has been reported in the literature, e.g., Han et al. J. Mater. Chem. A 5, 17293 (2017); Bo, Mao, Han, et al. Chem. Soc. Rev. 44, 2108 (2015).

During the stage of forming the pristine vertical graphene, the pressure in the chamber increases slightly, to around 1.5 to 1.8 Pa. The growth temperature for the vertical graphene was measured using a remote infrared thermometer and was about 400° C.

The growth time for the pristine vertical graphene was around 10-20 minutes. Around 10-20 minutes produces an optimal density of vertical graphene arising from the interplay of vertical graphene growth and etching in the plasma environment. After that time, the RF power was turned off and the gas flow was shut down. The pressure in the plasma chamber was again pumped down to as low as practicable, typically $<2\times10^{-2}$ Pa. The purpose of this pumping down step is to remove any residual carbon source in the vacuum chamber.

The pristine vertical graphene is then subjected to a post carbon treatment step in in the absence of any introduced carbon source, which leads to the branching of the pristine vertical graphene.

Following the evacuation of the chamber after deposition of the pristine vertical graphene, Argon was again introduced into the chamber at a flow rate of 10 standard cubic centimetre (sccm) and the pressure was again adjusted to 1.5 Pa. Around 0.5 to 2 Pa can be used as a pressure in the branching step. A radio-frequency (13.56 MHz) power of 1000 W was applied to generate an argon plasma. Ar is often used as a carrier gas to generate plasma in the growth step for making pristine vertical graphene. In the post carbon treatment step of the present process, the ion bombardment effect (sputtering and re-deposition) of Ar plasma is utilized for the formation of branches. $H_2$ is often used in the growth of pristine vertical graphene for etching effect which helps to grow a better quality graphene structure. The exact role of $H_2$ is difficult to investigate and is dependent on specific growth conditions.

While any suitable plasma containing inert gases can be used for the pre-treatment step, an Argon plasma is preferred for the post treatment step. It has been found that Ar plasma is effective for the branching, as Ar ions can bombard and knock out carbon atoms in vertical graphene, resulting in the vertical branched graphene structure.

Nitrogen, which can be used to generate relatively inert plasmas, is relatively undesirable as a plasma in the branching step as it can dope the graphene, leading to a different set of experimental results. Other reactive plasmas, such as oxygen plasmas are also clearly unsuitable as they lead to chemical changes in the graphene.

The post treatment, or branching step, is carried out for a predetermined time of typically between 1-20 minutes, depending upon the degree of branching desired. It was noted that less than 5 minutes will produce some branching, but the branching process is far from complete.

Carrying out the posttreatment for more than 30 minutes generally resulted in branched graphene with inferior electrical properties, due to the high density of disorders introduced into the graphene structure.

Typically, around 5-30 minutes can be used to produce branched graphene. Preferably, around 10 to 20 minutes under the conditions described was commonly adopted to produce high quality, highly branched graphene.

It is important to note that in the present invention, the formation of the pristine graphene and the process of branching occur as separate steps, with the branching step taking place in the absence of an introduced carbon source (i.e. the branching step takes place without the presence of any introduced graphene forming material, such as methane, ethane, ethylene, acetylene etc). Ideally, the deposition of pristine vertical graphene and branching takes place in the same apparatus, but this is not necessary. Pristine vertical graphene can be prepared in one location, stored and later treated to a branching step in a separate location according to the present invention if desired.

The methods of the prior art that involve "one-step" formation of branched graphene where the formation of vertical graphene and branching happen in a single step, in the presence of a carbon source suffer from the necessary condition that any branching step takes place in the presence of a carbon source. This means that the branching and deposition processes become conflated, leading to poorer results. In such one step processes, pristine vertical graphene of high quality is not formed as a discrete intermediate, rather, the formation of vertical graphene sheets is in competitive equilibrium from the outset with branching. The graphenes in these one step processes do not necessarily undergo branching at the uppermost edge of the sheets, but instead are just as likely to be branched at the base as the top. As a result, one step methodology tends to result in "dirtier" branched material.

Moreover, the present method quite distinctly separates the "coarse" structure formation (of the pristine vertical graphene sheets) and the "fine" structure formation (of the branches) to enable a relatively broad range of deposition and branching conditions to produce a consistent and controllable branched graphene product. In one step processes, the coarse and fine structure formation steps are conflated and modification of one parameter can lead to unpredictable changes in either the vertical sheet or branching structure. The present two-step process thus provides more control than a single step process.

Indeed, it has been observed by the present inventors that if the carbon source is present during the second (branching step), branching is difficult to be obtained. Without being bound by theory, this observation suggests that the mechanism of branching operates by ion bombardment (etching) and redeposition of the existing pristine vertical graphene.

Without wishing to be bound by theory, it is believed that the plasma ion bombardment effect leads to removal of carbon from the pristine graphene and simultaneous re-deposition of carbon atoms under the influence of the plasma-induced electric field. As a result, smaller graphene nanoflakes emanate from each pristine graphene sheet, forming the vertical branched graphene structure.

The branched graphene exhibits a hierarchical morphology which consists of a backbone of interconnected network of vertical graphene sheets and smaller graphene nanoflakes emanating from the backbone graphene sheets, making it a branched structure. Each branch may in turn support smaller graphene sheets, resembling a feather like formation with a central shaft backbone which is patterned like an interconnected network of vertical graphene sheets (formed during the growth step) that is fringed with vanes or barbs. While the appearance of the structure is feather like, the backbone remains similar to that of the pristine vertical graphene. As observed from the figures provided, it is observed that the morphology of vertical graphene backbone remains unchanged during the post carbon treatment, branching step.

The degree of branching of the vertical graphene is viewed by electron microscopes and quantifiable by analysing the Raman spectra of the graphene layer. As the degree of branching increases, the ratio of $I_D/I_G$ increases. In a pristine vertical graphene film deposited on Ni foil, with no branches, the $I_D/I_G$ ratio is typically around 1:1.

Figure 6:
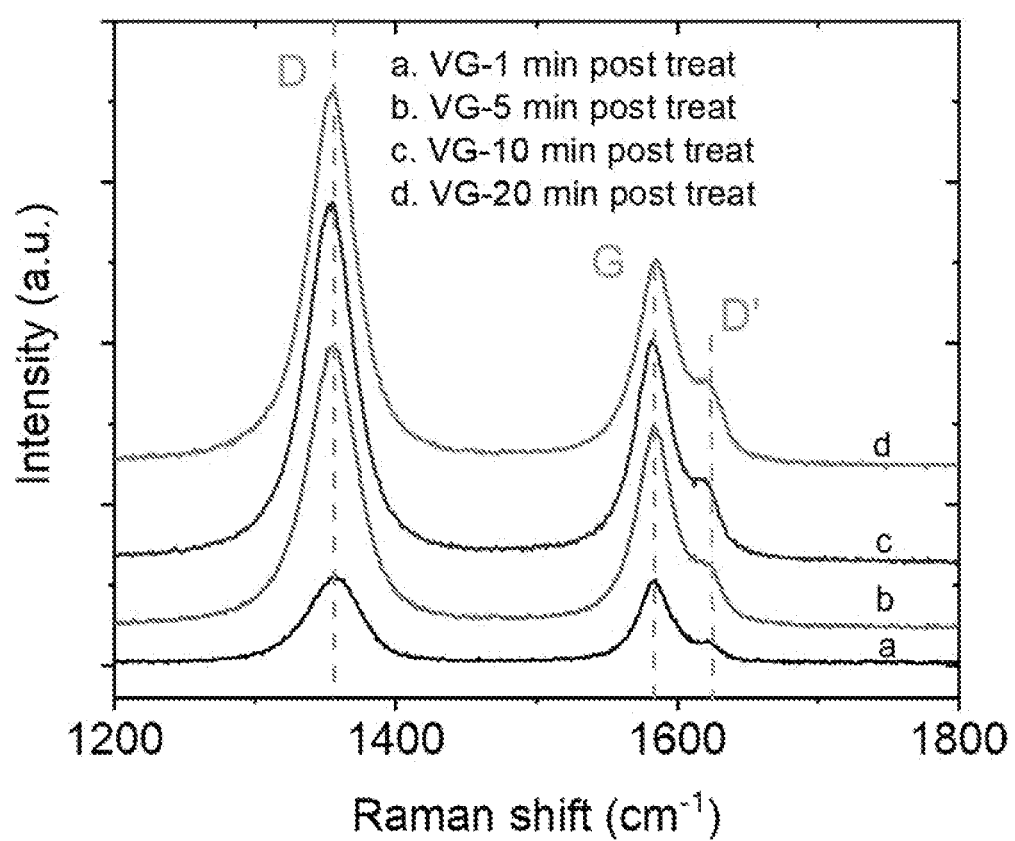
FIG. 6 shows the Raman spectra of the vertical graphenes with around 1, 5, 10, and 20 minutes of post treatment with an inert plasma. An increase in the ratio of the intensities of the $I_D/I_G$ peaks is observed when the post treatment period is prolonged.
Figure 7:
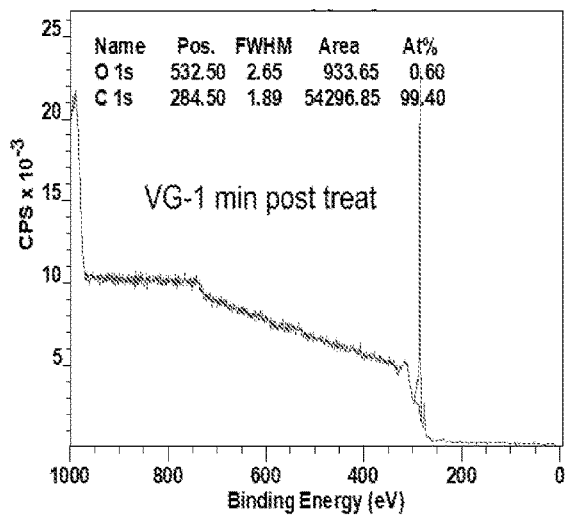
FIG. 7 shows the XPS of the vertical graphenes with around 1, 5, 10, and 20 minutes of post treatment with an inert plasma. The oxygen content, which is normally considered as the impurity in the vertical graphene material, remains low at ~1% in all vertical graphenes with around 1, 5, 10, and 20 minutes of post treatment.
Figure 7:
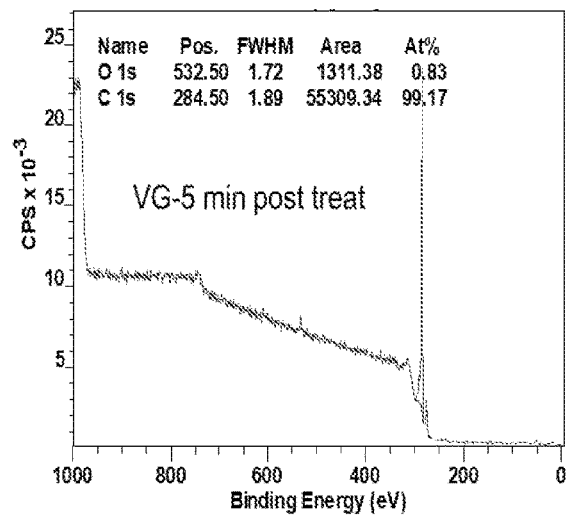
Figure 7:
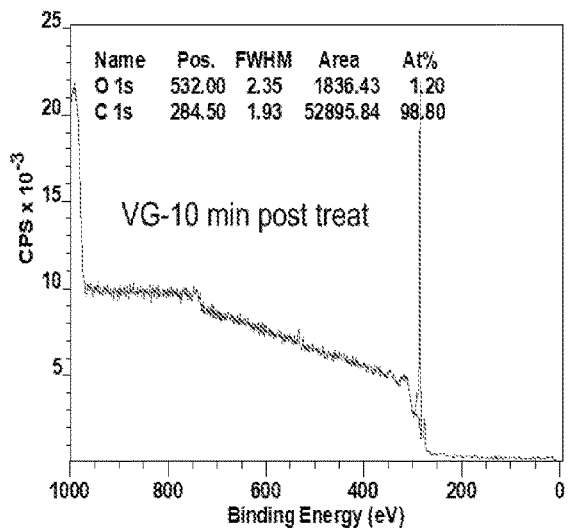
Figure 7:
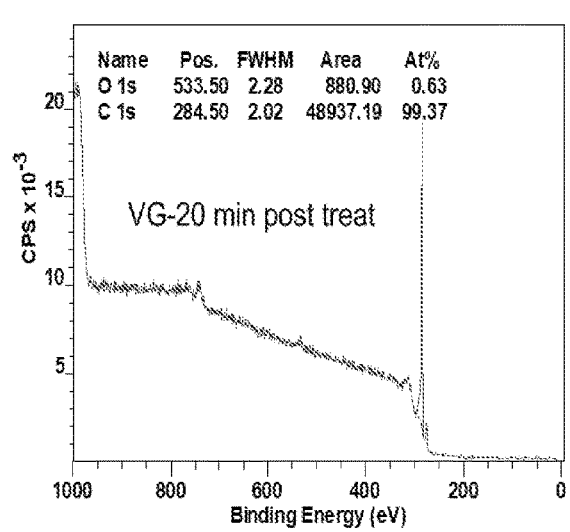
Figure 8:
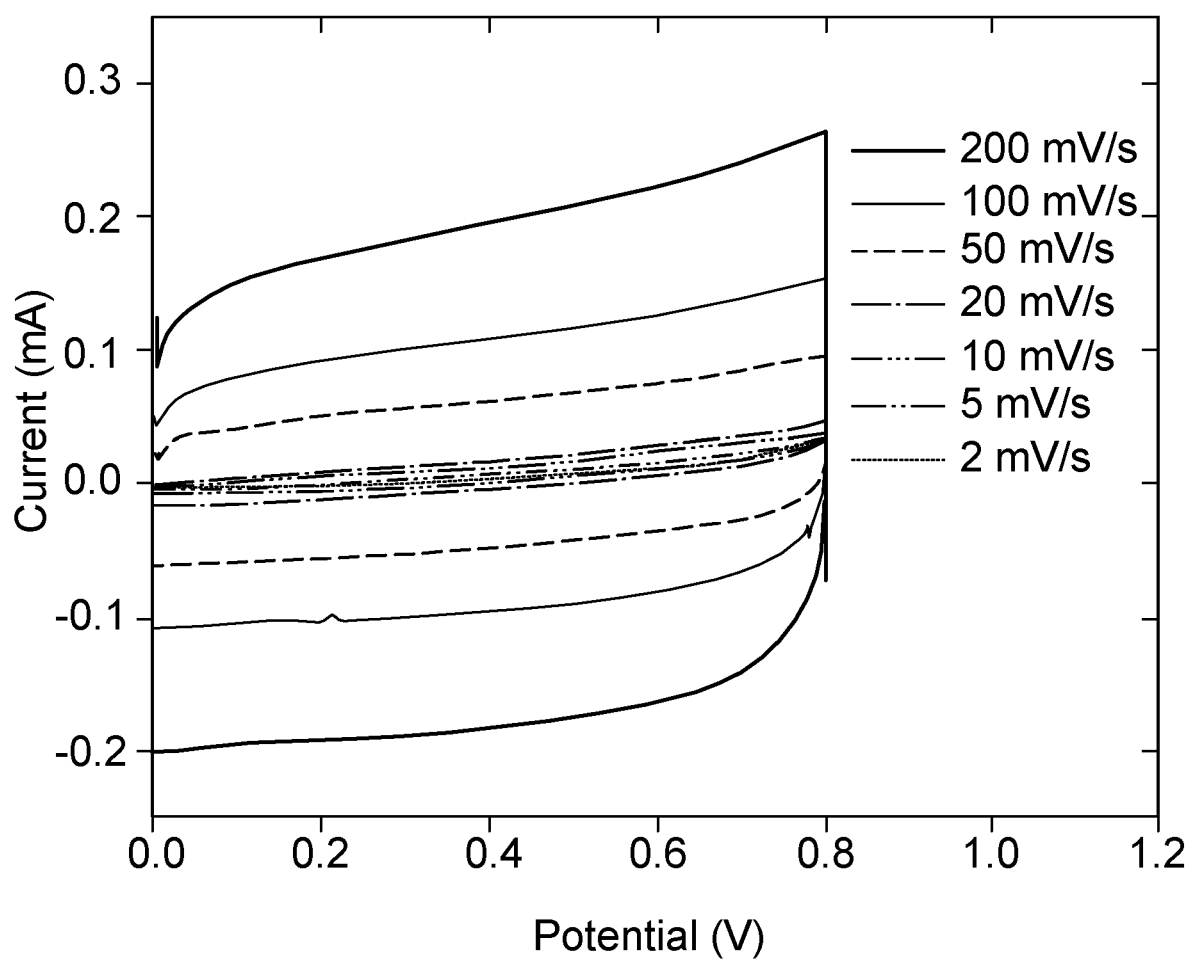
FIG. 8 shows the electrochemical cyclic voltammetry (CV) measurements of unbranched or pristine vertical graphene when assembled into a type 2032 coin cell with symmetric unbranched or pristine vertical graphene electrodes and 1 M $Li_2SO_4$ electrolyte, at scan rates of 2, 5, 10, 20, 50, 100 and 200 mV/s.
Figure 9:
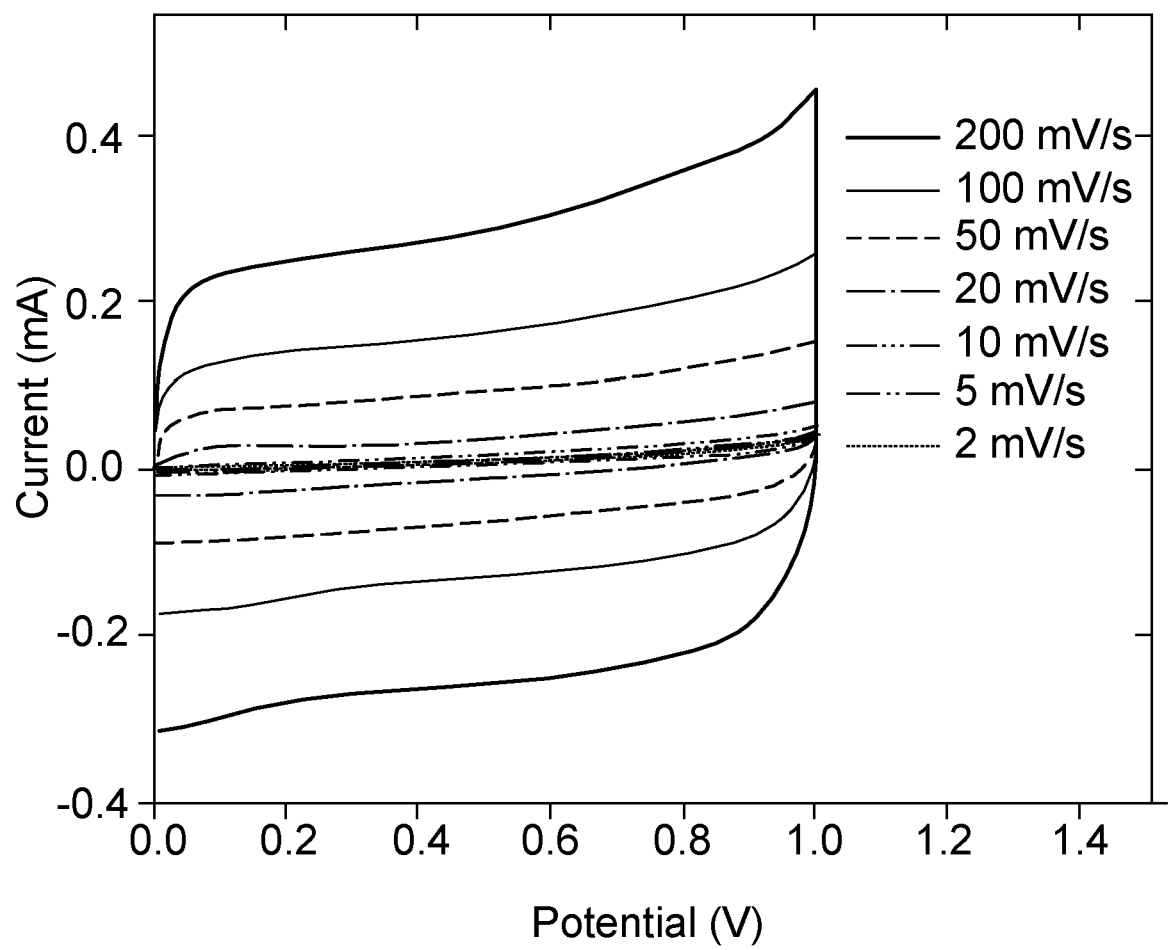
FIG. 9 shows the electrochemical cyclic voltammetry (CV) measurements of vertical branched graphene with around 1, 5, 10, and 20 minutes of post treatment when assembled into a type 2032 coin cell with symmetric unbranched or pristine vertical graphene electrodes and 1 M $Li_2SO_4$ electrolyte, at scan rates of 2, 5, 10, 20, 50, 100 and 200 mV/s.
Figure 10:
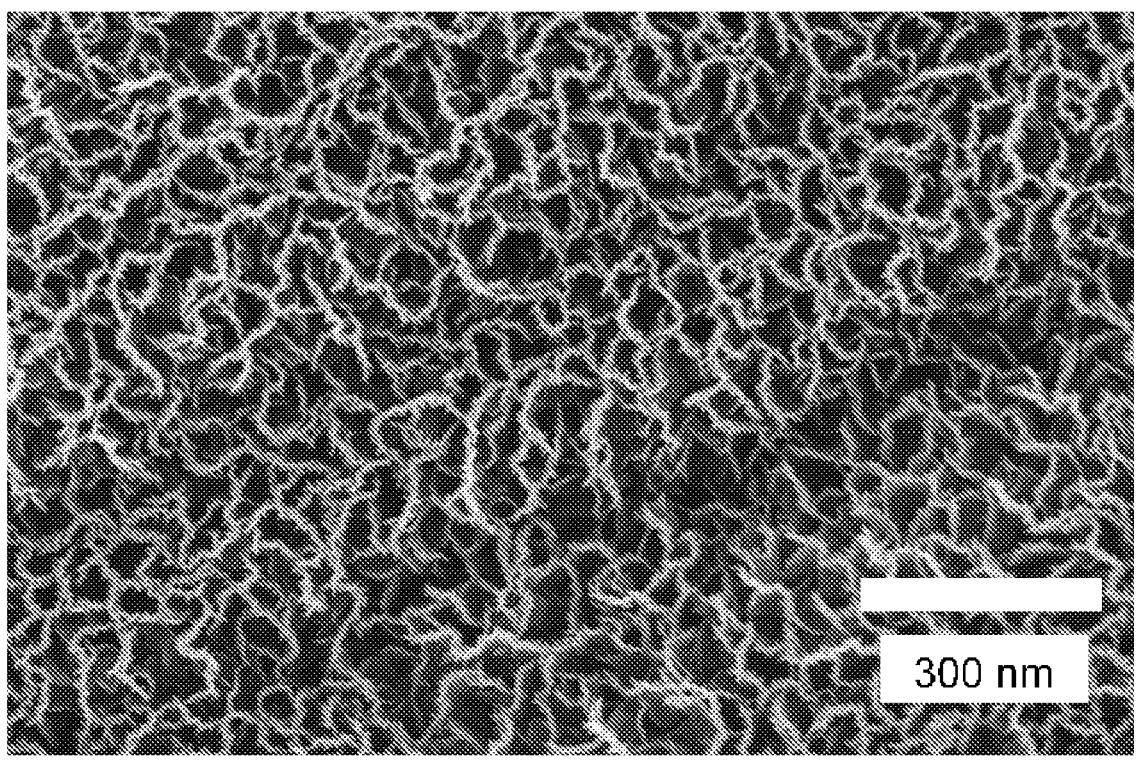
FIG. 10 shows a SEM image of Ni—Fe nanoparticles catalyst electrodeposited on vertical branched graphene with around 1 minute of post treatment, looking downwards towards the deposition substrate.

As the post-treatment continues, the degree of branching increases, as can be seen microscopically, and a concomitant increase in the ratio of $I_D/I_G$ can be observed. See FIG. 6. In FIG. 6, it can be seen that the relative ratio changes over time, indicating a greater degree of disordering. See Table 1 below for the results.

TABLE 1

| $I_D/I_G$ Vs Post Treatment Time | |
| --- | --- |
| Post Treatment Time (min) | $I_D/I_G$ |
| 1 | 1.1 |
| 5 | 1.4 |
| 10 | 1.7 |
| 20 | 1.9 |

Once formed, the vertical branched graphene can be removed by any suitable means, for example, by way of a blade or other scraping means if a powder form is desired. Alternatively, if a suspension of vertical graphene is required it can be removed by immersion into a liquid such as acetone or an alcohol such as ethanol under ultrasonication. Compared to the removal of flat sheet graphene from the formation substrate, the removal of vertical branched graphene to produce freestanding vertical graphene is very convenient. Moreover, the formation substrates can be readily reused, commencing with the plasma pre-treatment step.

The freestanding branched graphene appeared as black powder. The XPS spectra of the freestanding branched graphene showed that it was high purity, averaging in excess of 99% carbon, with little oxygen.

The density of edge planes in the vertical graphene can be increased by more than 10 times during the post carbon treatment step, therefore, allowing the disposition of a range of catalysts at high mass loading, using a range of reaction conditions. This structure also has the added advantage of allowing mixing of reagents with deposited catalysts. Of particular advantage is the deposition of single atom catalysts on substrates that are preferably anchored on the edge planes of vertical graphene.

EXAMPLES

Synthesis of Vertical Branched Graphene (Growth Step)

Vertical branched graphene was synthesized in a plasma-enhanced chemical vapour deposition (PECVD) process without using any catalyst. Specifically, a substrate is loaded into the chamber and the pressure is pumped down to <$2\times10^{-2}$ Pa. The substrate can be metal foils such as stainless steel, copper, aluminum or nickel; semiconductors such as silicon wafer; insulators such as quartz or sapphire; carbon paper; carbon fibre; nickel foam; or copper foam. Then, Ar at a flow rate of 10 standard cubic centimetre (sccm) is introduced into the chamber and the pressure is adjusted to 1.5 Pa. Ar plasma with a radio frequency (13.56 MHz) at power of 1000 W is ignited to pre-treat the substrate surface for 10 minutes.

After that, both methane and hydrogen gases at a flow rate of 10 sccm are added to the chamber to synthesize pristine vertical graphene without interrupting the plasma. The pressure during the synthesis increases slightly to 1.5-1.8 Pa. The growth temperature was measured using an external infrared thermometer and was found to be ca. 400° C. After another 10 minutes, the plasma is turned off and all the gases are shut.

Synthesis of Vertical Branched Graphene (Post Treatment Step)

The vacuum chamber is then pumped down to <$2\times10^{-2}$ Pa. Ar at a flow rate of 10 standard cubic centimetre (sccm) is introduced into the chamber and the pressure is again adjusted to 1.5 Pa. Ar plasma with a radio frequency (13.56 MHz) power of 1000 W is activated to post-treat the vertical graphene for a designated time (e.g., 1, 5, 10, or 20 minutes). Owing to the plasma ion bombardment effect and re-deposition of carbon atoms, smaller graphene nanoflakes can emanate from the pristine graphene sheet, forming the vertical branched graphene structure. The height of the vertical branched graphene can be controlled by the height of the pristine graphene, which can be varied by a number of plasma processing parameters such as deposition time, flow rate, plasma power and pressure.

Applications Using Vertical Branched Graphene

Carbon powders are well known materials in electrochemical devices and the electrochemical properties of the vertical branched graphene of the present invention were investigated.

A coin cell was constructed using symmetric pristine vertical graphene electrodes and 1 M $Li_2SO_4$ as the electrolyte. An otherwise identical cell was constructed using vertical branched graphene of the present invention.

The cyclic voltammetry (CV) of each cell at scan rates of 2, 5, 10, 20, 50, 100 and 200 mV/s was plotted. The vertical branched graphene showed similar impedance and stability as the pristine vertical graphene but exhibited specific capacitance (Cs) 1.5 times higher than that of the pristine unbranched graphene.

Preliminary data also shows that freestanding branched graphene powder performed better in energy storage devices and also as catalyst support for hydrogen generation and $CO_2$ reduction.

The nonprecious metal catalysts of Ni and Ni—Fe alloy were electrodeposited on both pristine vertical graphene (on carbon fibre paper) and the vertical branched graphene (on carbon fibre paper). Their catalytic performance for oxygen evolution reactions (OER) was tested in the alkaline 1 M KOH electrolyte.

Figure 11:
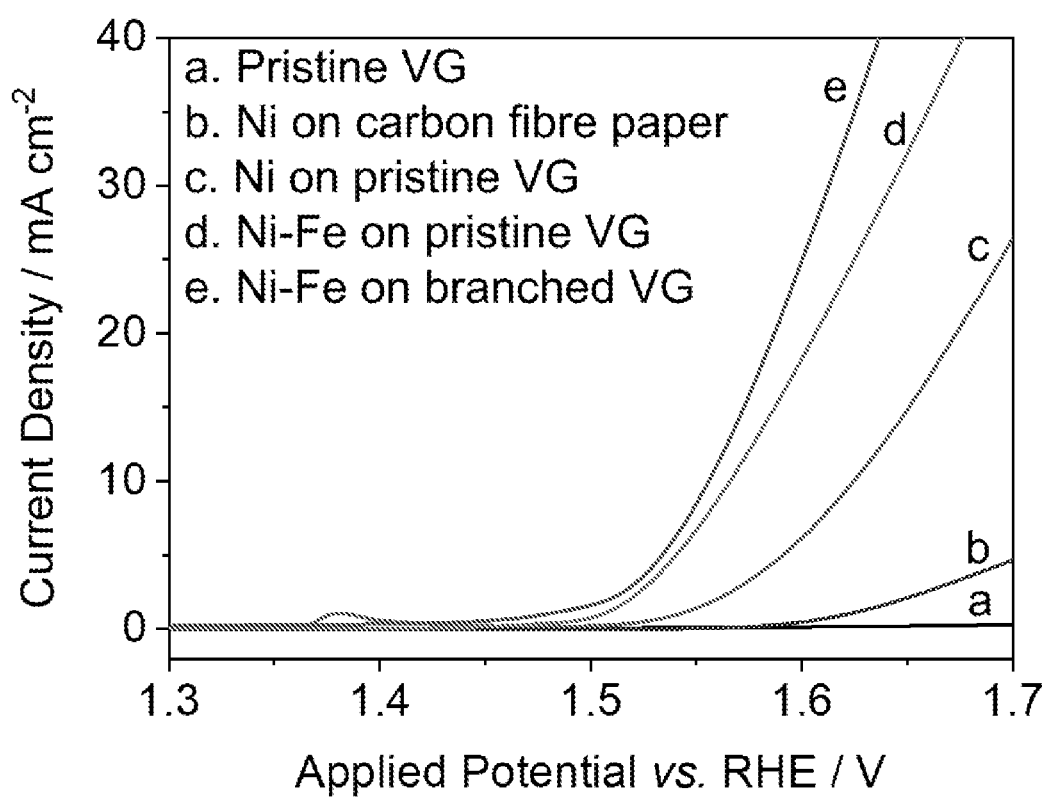
FIG. 11 shows the OER catalytic performances of the pristine vertical graphene, the Ni nanoparticles catalyst electrodeposited on carbon fibre paper, the Ni nanoparticles catalyst electrodeposited on the pristine vertical graphene, the Ni—Fe nanoparticles catalyst electrodeposited on the pristine vertical graphene, and the Ni—Fe nanoparticles catalyst electrodeposited on the vertical branched graphene. Of these tested catalysts, the Ni—Fe nanoparticles catalyst electrodeposited on vertical branched graphene showed the best OER performance, by giving the highest current density at a fixed applied potential versus reversible hydrogen electrode (RHE), or the lowest applied potential versus reversible hydrogen electrode (RHE) at a fixed current density.

As can be seen in FIG. 11, the linear sweep voltammetry (LSV) showed that the Ni—Fe catalyst electrodeposited on the branched graphene had the best OER performance among the pristine vertical graphene (on carbon fibre paper), the Ni catalyst electrodeposited on carbon fibre paper, the Ni catalyst electrodeposited on the pristine vertical graphene (on carbon fibre paper), and the Ni—Fe catalyst electrodeposited on the pristine vertical graphene (on carbon fibre paper).

Figure 12:
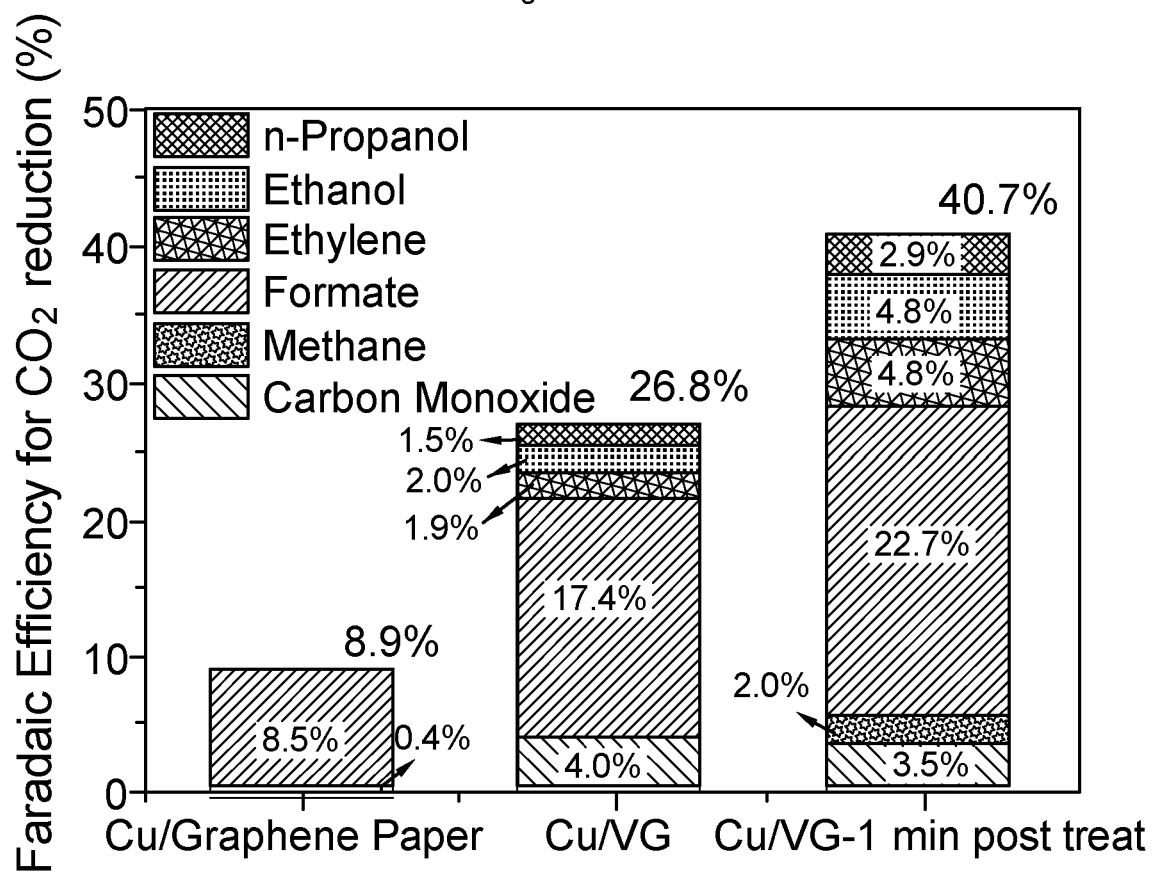
FIG. 12 shows the Faradaic efficiency towards $CO_2$ products of copper (Cu) electrodeposited on graphite paper, pristine VG, and branched VG with 1 minute post treatment substrates. Of the catalysts tested at an applied potential of 1.2 vs. RHE after 1.5 hours, the copper electrodeposited on vertical branched graphene with 1 minute post treatment showed the highest faradaic efficiency towards $CO_2$ reduction products, as well as the highest proportion of C2+ products such as ethylene, ethanol and n-propanol. Approximately 31% of all carbon products produced consist of C2+ species.

The use of various branched graphenes as catalytic supports in the electrochemical reduction of $CO_2$ was investigated. The results are presented in FIG. 12, which shows the Faradaic efficiency towards $CO_2$ products of copper (Cu) electrodeposited on graphite paper, pristine vertical graphene (on graphite paper) and vertical branched graphene (on graphite paper) with 1 min post treatment substrates. Of the catalysts tested at an applied potential of 1.2 vs. RHE after 1.5 hours, the copper electrodeposited on vertical branched graphene (on graphite paper) with 1 min post treatment showed the highest faradaic efficiency towards $CO_2$ reduction products, as well as the highest proportion of C2+ products such as ethylene, ethanol and n-propanol. Approximately 31% of all carbon products produced consist of C2+ species.

Table 2 lists the $CO_2$ reduction results of copper (Cu) electrodeposited on graphite paper, vertical graphene (on graphite paper), and vertical branched graphene (on graphite paper) with 1 min post treatment substrates. Of the catalysts tested at an applied potential of 1.2 vs. RHE after 1.5 hours, the copper electrodeposited on vertical branched graphene (on graphite paper) with 1 min post treatment showed the highest total average current density, highest average current density towards $CO_2$ reduction products and the highest amount of $CO_2$ reduction products produced including both gaseous and liquid products, including the C2+ products.

Thus, a nonprecious metal catalyst of Cu nanoparticles electrodeposited on the vertical branched graphene gave a higher yield of liquid carbon products such as n-propanol, ethanol and formate in the reduction of $CO_2$, compared to the Cu catalyst electrodeposited on the pristine vertical graphene and carbon fibre paper.

In a further example, the present invention can be used to prepare a hydrogen generating catalyst.

Figure 13:
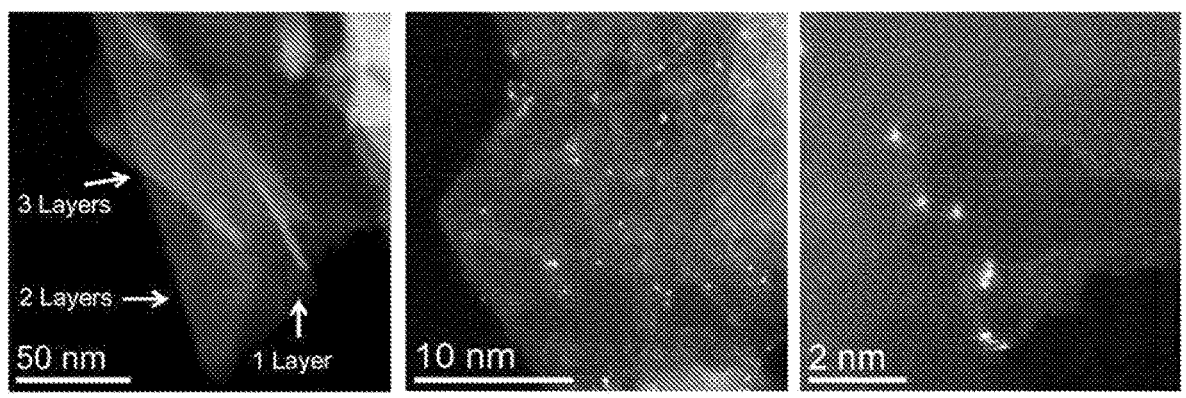
FIG. 13 shows the aberration-corrected scanning transmission electron microscopy (AC STEM) images of platinum (Pt) single atoms anchored on vertical branched graphene with 5 minutes of post treatment. Pt single atoms were immobilized through an impregnation-annealing method using $H_2PtCl_6$ as the precursor.

Pristine vertical graphene was prepared as above and then given a 5-minute post treatment (branching) treatment. The subsequently vertical branched graphene was then subject to an impregnation-annealing method using $H_2PtCl_6$ as the precursor to produce immobilized Pt single atoms on the graphene surface. FIG. 13 shows the aberration-corrected scanning transmission electron microscopy (AC STEM) images of platinum (Pt) single atoms anchored on vertical branched graphene.

Figure 14:
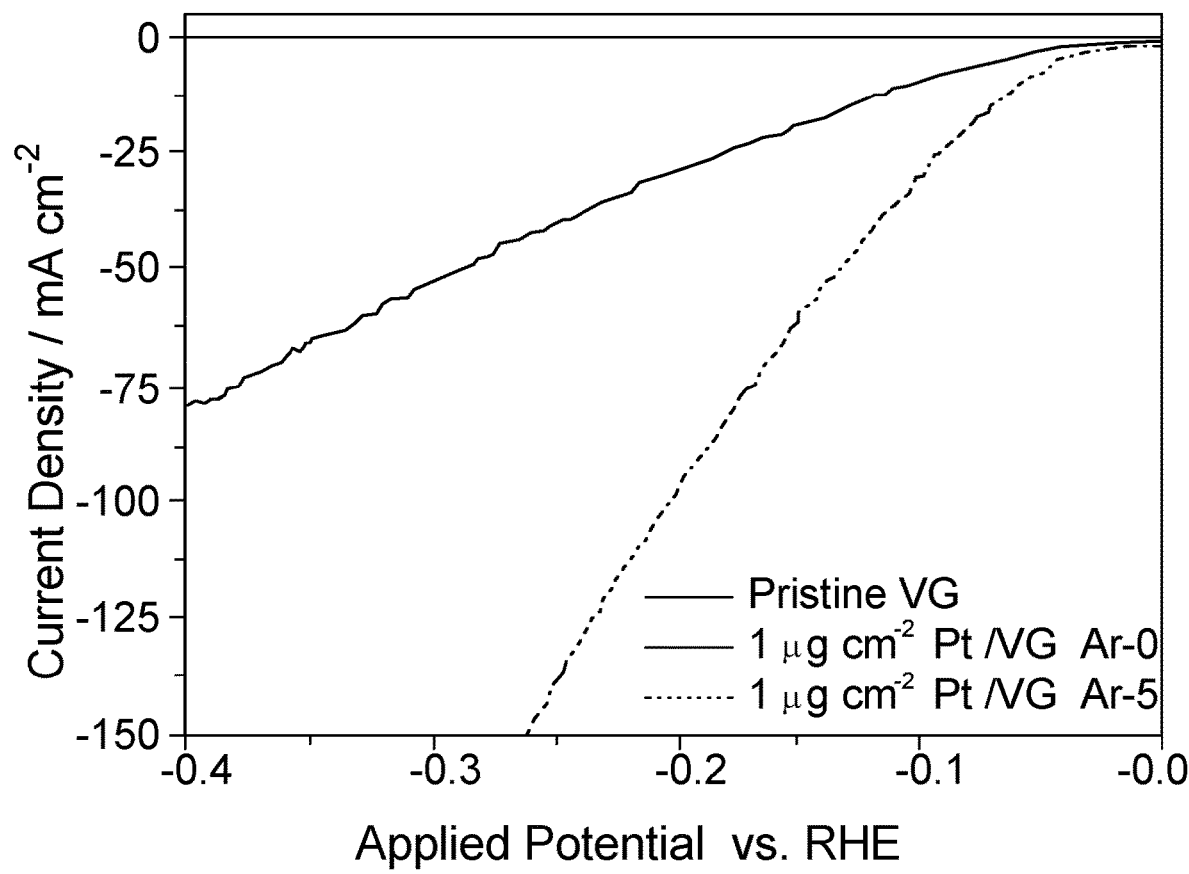
FIG. 14 shows the hydrogen evolution reaction (HER) performances of the pristine vertical graphene, the Pt single atoms anchored on the pristine vertical graphene at 1 µg $cm^{-2}$, and the Pt single atoms anchored on the vertical branched graphene with 5 minutes of post treatment at 1 µg $cm^{-2}$, tested in a three-electrode configuration with 0.5 M $H_2SO_4$ electrolyte. Of these tested catalysts, the Pt single atoms anchored on the vertical branched graphene with 5 minutes of post treatment showed the best HER performance, by giving the highest current density at a fixed applied potential versus RHE, or the lowest applied potential versus RHE at a fixed current density.

FIG. 14 shows the hydrogen evolution reaction (HER) performances of the pristine vertical graphene, the Pt single atoms anchored on the pristine vertical graphene at 1 μg $cm^{-2}$, and the Pt single atoms anchored on the vertical branched graphene with 5 minutes of post treatment at 1 μg $cm^{-2}$, tested in a three-electrode configuration with 0.5 M $H_2SO_4$ electrolyte. HER is a well-known process in the field which involves the conversion of $H_2O \rightarrow H_2$ and $O_2$. The catalytic performance, i.e., amount of $H_2$ generated, can be viewed by current density at a fixed applied potential versus RHE, or the applied potential versus RHE at a fixed current density, as described here. Of these tested catalysts, the Pt single atoms anchored on the vertical branched graphene with 5 minutes of post treatment showed the best HER performance, by giving the highest current density at a fixed applied potential versus RHE, or the lowest applied potential versus RHE at a fixed current density.

TABLE 2

| Sample | Amount of Product | | | | | | Total Gas Products/ μmol | Total Liquid Products/ μmol | Total C2+ Products/ μmol | Total CO$_2$ Reduction Products/ μmol | Average Current Density/ mA | Average Current Density towards CO$_2$ reduction products/ mA |
|---|---|---|---|---|---|---|---|---|---|---|---|---|
| | Carbon Monoxide (CO)/ μmol | Methane (CH$_4$)/ μmol | Formic Acid (HCOOH)/ μmol | Ethylene (C$_2$H$_4$)/ μmol | Ethanol (C$_2$H$_5$OH)/ μmol | n-Propanol (n-C$_3$H$_7$OH)/ μmol | | | | | | |
| Cu/Graphene Paper | 1.3 | 0 | 25 | 0 | 0 | 0 | 1.3 | 25 | 0 | 26.3 | 10.5 | 0.93 |
| Cu/VG | 11.9 | 0 | 52 | 0.9 | 1 | 0.5 | 12.8 | 53.5 | 2.4 | 66.3 | 10.7 | 2.9 |
| Cu/VG with 1 min post treatment | 11.0 | 1.6 | 70.5 | 2.5 | 2.5 | 1 | 15.1 | 74 | 6 | 89.1 | 11.7 | 4.8 |

The invention claimed is:

1. A method of preparing a vertical branched graphene comprising:
   treating a pristine vertical graphene with an inert plasma in the absence of an introduced carbon source to develop a vertical branched graphene,
   wherein the pristine vertical graphene is treated with an inert plasma so as to produce the vertical branched graphene.

2. The method according to claim 1 wherein the inert plasma used to develop a vertical branched graphene is an Argon plasma.

3. The method according to claim 1 wherein the plasma is applied at a pressure of <5 Pa.

4. The method according to claim 1, wherein the vertical branched graphene comprises an interconnected network of vertical graphene sheets and smaller graphene nanoflakes emanating from the vertical graphene sheets.

5. The method according to claim 1 wherein the plasma is applied at a radio frequency of 10-15 MHz.

6. The method according to claim 1 wherein the plasma is applied at a power of 500-2000 W.

7. The method according to claim 1, wherein the pressure is from 0.5 Pa to 2 Pa.

8. The method according to claim 1, wherein the plasma is applied for a predetermined period of at least 1 minute to produce a predetermined level of branching.

9. The method according to claim 8, wherein the predetermined period is from 5 minutes to 20 minutes.

10. The method according to claim 1, wherein the vertical branched graphene exhibits a ratio $I_D/I_G$ of at least 1.1.

11. The method according to claim 10, wherein the ratio $I_D/I_G$ is from 1.4 to 1.9.

12. The method according to claim 1 wherein the only heating applied is heating by the plasma.

13. A method of preparing a vertical branched graphene comprising:
   treating a pristine vertical graphene with an inert plasma in the absence of an introduced carbon source to develop a vertical branched graphene,
   wherein the plasma is applied at a pressure of <5 Pa.

14. The method according to claim 13 wherein the inert plasma used to develop a vertical branched graphene is an Argon plasma.

15. The method according to claim 13 wherein the plasma is applied at a radio frequency of 10-15 MHz.

16. The method according to claim 13 wherein the plasma is applied at a power of 500-2000 W.

17. The method according to claim 13 wherein the only heating applied is heating by the plasma.

18. The method according to claim 13, wherein the pressure is from 0.5 Pa to 2 Pa.

19. The method according to claim 13, wherein the plasma is applied for a predetermined period of at least 1 minute to produce a predetermined level of branching.

20. The method according to claim 19, wherein the predetermined period is from 5 minutes to 20 minutes.

\* \* \* \* \*